United States Patent
Harsch et al.

(10) Patent No.: US 12,058,844 B2
(45) Date of Patent: Aug. 6, 2024

(54) COOLANT DISCHARGER FOR A COOLANT-CARRYING PIPELINE NETWORK, ELECTRICAL ENERGY STORAGE DEVICE AND MOTOR VEHICLE

(71) Applicant: Bayerische Motoren Werke Aktiengesellschaft, Munich (DE)

(72) Inventors: Thomas Harsch, Munich (DE); Thomas Zink, Munich (DE)

(73) Assignee: Bayerische Motoren Werke Aktiengesellschaft, Munich (DE)

( * ) Notice: Subject to any disclaimer, the term of this patent is extended or adjusted under 35 U.S.C. 154(b) by 80 days.

(21) Appl. No.: 17/703,432

(22) Filed: Mar. 24, 2022

(65) Prior Publication Data
US 2022/0312647 A1    Sep. 29, 2022

(30) Foreign Application Priority Data

Mar. 26, 2021    (DE) .................... 10 2021 107 625.0

(51) Int. Cl.
*H05K 7/20*    (2006.01)
*B60L 58/26*    (2019.01)
*B60R 16/08*    (2006.01)

(52) U.S. Cl.
CPC ......... *H05K 7/20845* (2013.01); *B60R 16/08* (2013.01); *B60L 58/26* (2019.02)

(58) Field of Classification Search
CPC ........ B60R 16/08; B60L 58/26; H01M 50/60; H01M 10/6567; G01M 3/183
See application file for complete search history.

(56) References Cited

U.S. PATENT DOCUMENTS 9,316,337 B2 *    4/2016    Bellis ...................... F16L 35/00
10,638,645 B1 *    4/2020    Moen ................... G21C 15/182

FOREIGN PATENT DOCUMENTS

| DE | 10 2008 059 969 A1 | 6/2010 |
| EP | 2 760 075 A1 | 7/2014 |
| KR | 10-2020-0115386 A | 10/2020 |

OTHER PUBLICATIONS

German-language Office Action issued in German Application No. 10 2021 107 625.0 dated Oct. 11, 2021 with partial English translation (eight (8) pages).

* cited by examiner

*Primary Examiner* — Lionel Nouketcha
(74) *Attorney, Agent, or Firm* — Crowell & Moring LLP

(57) ABSTRACT

A coolant discharger for a coolant-carrying pipeline network of an electrical energy storage device has at least one drainage ramp configured to be arranged on a pipeline portion of the pipeline network that is susceptible to a coolant leakage, the drainage ramp is configured to discharge a coolant leaking out from the pipeline portion in the event of a coolant leakage and to divert it away from voltage-carrying components of the electrical energy storage device.

14 Claims, 3 Drawing Sheets

COOLANT DISCHARGER FOR A COOLANT-CARRYING PIPELINE NETWORK, ELECTRICAL ENERGY STORAGE DEVICE AND MOTOR VEHICLE

CROSS REFERENCE TO RELATED APPLICATION

This application claims priority under 35 U.S.C. § 119 from German Patent Application No. DE 10 2021 107 625.0, filed Mar. 26, 2021, the entire disclosure of which is herein expressly incorporated by reference.

TECHNICAL FIELD

The disclosure relates to a coolant discharger for a coolant-carrying pipeline network of an electrical energy storage device. The disclosure also relates to an electrical energy storage device having a pipeline network, and to a motor vehicle.

BACKGROUND

Interest in this case is directed toward electrical energy storage devices for motor vehicles, that can be used, for example, as traction batteries for motor vehicles realized as hybrid or electric vehicles. Such electrical energy storage devices usually have a multiplicity of voltage-carrying components, for example energy storage cells, leads, control devices, terminals, etc., that are arranged in an interior space of a storage housing of the electrical energy storage device. In addition, the electrical energy storage device usually has a coolant-carrying cooling system for cooling the voltage-carrying components, in particular the energy storage cells. In the event of a coolant leakage at the cooling system, the leaking electrically conductive coolant can cause short circuits, which are problematic, in particular, in the case of components of the energy storage device that carry a high voltage.

SUMMARY

The object of the present disclosure is to provide a solution for preventing faults at interfaces, in the case of an electrical energy storage device, that are caused by coolant leakage.

This object is achieved according to the disclosure by a coolant discharger, an electrical energy storage device and a motor vehicle having the features disclosed herein. Advantageous executions of the disclosure are also disclosed herein.

A coolant discharger according to the disclosure for a coolant-carrying pipeline network of an electrical energy storage device has at least one drainage ramp for arrangement on a pipeline portion of the pipeline network that is susceptible to a coolant leakage. The at least one drainage ramp is designed to discharge a coolant leaking out from the pipeline portion in the event of a coolant leakage and to divert it away from voltage-carrying components of the electrical energy storage device.

Furthermore, the disclosure relates to an electrical energy storage device for a motor vehicle, having at least one voltage-carrying, in particular high-voltage-carrying, component, a coolant-carrying pipeline network for cooling the voltage-carrying component, the pipeline network having at least one pipeline portion susceptible to a coolant leakage, and at least one coolant discharger according to the disclosure. The electrical energy storage device is in particular realized as a rechargeable traction battery, or traction accumulator, for the motor vehicle.

The energy storage device has a multiplicity of voltage-carrying components. Such voltage-carrying components are, for example, energy storage cells that are interconnected to form energy storage modules, and leads and terminals. The voltage-carrying components are arranged in a storage housing of the energy storage device. It may be provided, for example, that the electrical energy storage device is of a multi-level design, in that the energy storage modules are arranged in at least two levels, one above the other. Preferably, the energy storage device is a high-voltage energy storage device and has high-voltage-carrying components. Such high-voltage-carrying components may be, for example, high-voltage leads and high-voltage terminals that are electrically connected to the mutually interconnected energy storage modules.

The electrical energy storage device additionally has a cooling system that has a coolant-carrying pipeline network and at least one heat sink connected to the pipeline network. The at least one heat sink may be a cooling plate through which coolant can flow, and may be arranged on the energy storage cells to absorb waste heat from the energy storage cells. For example, each energy storage module may have a cooling plate on which the energy storage cells of the energy storage module are arranged. The pipeline network may be connected to a cooling circuit of the motor vehicle in which the coolant circulates and via which the absorbed waste heat can be dissipated. A coolant in this case is understood in general to mean a heat transfer medium, i.e. also a refrigerant. The pipeline network has at least one pipeline portion susceptible to a coolant leakage. Such a pipeline portion has in particular at least one pipeline connection that forms an interface between two pipelines of the pipeline network. This at least one pipeline connection connects in particular the pipelines for energy storage modules of a first, lower level to pipelines for energy storage modules of a second, upper level. For this purpose, the pipeline connection has in particular two pipeline elements in the form of pipe connection elements, or pipe connectors. For example, the pipeline connection may be realized as a sleeve connection, in which a first pipe connection element is realized as a pipe stub and can be inserted into a second pipe connection element in the form of a pipe sleeve. Such pipeline connections that form interfaces between two pipelines may also be quick couplings, quick connectors, snap-on (fir-tree) connections, hose-clamp connections, etc.

The coolant discharger is provided in order to prevent coolant that, in the event of a leakage in the region of the pipeline portion susceptible to coolant leakage, leaks out from the pipeline network, from reaching the voltage-carrying components and causing short circuits there, for example. These short circuits are problematic in particular in the region of the upper level in the storage housing, since this is where the high-voltage leads, carrying high voltage, and high-voltage terminals are arranged. The coolant discharger has at least one drainage ramp, or at least one watershed element, that is attached to the susceptible pipeline portion and diverts the leaking coolant away from the voltage-carrying components.

In particular, at least one pipeline element of the pipeline portion susceptible to coolant leakage is attached to the drainage ramp, forming a preassembled assembly. Preferably, the at least one pipeline element is realized as one of the pipe connectors. The at least one drainage ramp is attached to the at least one pipe connector, in particular to at least one pipe connector assigned to the lower level. The drainage ramp and the pipe connector thus form the preassembled assembly. The drainage ramp may be, for example, a molded part made of a plastic, for example an injection-molded part, and can thus be produced in a particularly cost-effective manner. The drainage ramp may also be made of metal or realized by a foil. The drainage ramp may also be formed in one piece with the pipeline element. The drainage ramp may discharge the leaking coolant, for example, to a defined region within the storage housing. The defined region may be located on a housing base of the storage housing, for example beneath the energy storage modules of the lower level. Such a drainage ramp enables faults caused by coolant leakage to be prevented in a simple and cost-effective manner.

Preferably, the at least one drainage ramp has a discharge portion, sloping obliquely downward, for arrangement beneath the at least one pipeline portion susceptible to coolant leakage, and has a wall portion, projecting upward from the discharge portion, for partially encasing the pipeline portion. The discharge portion is arranged beneath the pipeline portion in a direction of dripping of the coolant leaking out from the pipeline portion. The wall portion projects upward from the discharge portion, contrary to the direction of dripping, and surrounds the pipeline portion in certain regions. The wall portion, which only partially surrounds the pipeline portion along a circumferential direction, allows the coolant to drain off specifically only on one side of the drainage ramp left free by the wall portion. The wall portion separates the discharge portion from the voltage-carrying components.

The wall portion may have, for example, two side wall regions and a rear wall region that surrounds the pipeline portion from three sides. Starting from the rear wall region, the discharge portion slopes obliquely forward and discharges the coolant downward. The discharge portion may be rectangular in shape, for example, such that the drainage ramp is realized as an upwardly and forwardly open, substantially rectangular bowl that has an obliquely sloping base. The at least one pipeline connection on which the at least one drainage ramp is arranged may be angled, such that the discharge portion is arranged beneath a first, for example horizontal, tubular leg of the pipeline connection, and the wall portion surrounds a second, for example vertical, tubular leg of the pipeline connection in certain regions.

In one embodiment, the wall portion has at least one convexity for receiving a sub-region of the pipeline portion. The drainage ramp is thus formed onto the sub-region of the pipeline portion, for example onto the tubular second leg, and can thus be realized in a particularly space-saving manner. Preferably, the wall portion has two convexities for receiving two adjacent sub-regions of the susceptible pipeline portion. The two sub-regions may originate, for example, from two adjacent pipeline connections, such that a drainage ramp can discharge the leaking coolant of second pipeline connections.

It proves advantageous if the coolant discharger has a connection portion for mechanically connecting the drainage ramp to the storage housing of the electrical energy storage device. In particular, the connection portion is realized as tabs that project laterally from the discharge portion and that each have at least one hole. Via the tabs, the drainage ramp can be screw-fastened, for example, to the storage housing, in that screws are passed through the holes, or eyelets, and screwed to the storage housing. The drainage ramp may be supported, for example, on a retaining strut of the storage tank housing, in the region of the tabs, and be screwed to it. The connection portion is in particular realized in one piece with the drainage ramp.

In a development of the disclosure, the coolant discharger has a holding element for holding the drainage ramp on the at least one pipeline portion. In particular, the holding element is realized as a bracket attached in a non-destructively detachable manner to the drainage ramp. The bracket is in particular a separate constructional element that is attached to the pipeline portion. By means of the holding element, the pipeline portion can be preassembled on the drainage ramp to form the assembly.

The disclosure additionally relates to a motor vehicle having at least one electrical energy storage device. The motor vehicle is in particular an electrically drivable motor vehicle and has the electrical energy storage device as a traction battery.

The embodiments presented with reference to the coolant discharger according to the disclosure, and their advantages, apply correspondingly to the electrical energy storage device according to the disclosure and to the motor vehicle according to the disclosure.

Further features of the disclosure are evident from the claims, the figures and the description of the figures. The features and combinations of features mentioned above in the description, as well as the features and combinations of features mentioned below in the description of the figures and/or shown in the figures alone, are applicable not only in the combination indicated in each case, but also in other combinations or on their own.

The disclosure will now be explained in greater detail on the basis of a preferred exemplary embodiment and with reference to the drawings.

Other objects, advantages and novel features of the present disclosure will become apparent from the following detailed description of one or more preferred embodiments when considered in conjunction with the accompanying drawings.

DETAILED DESCRIPTION OF THE DRAWINGS

In the figures, elements that are the same, and elements that have the same function, are denoted by the same references.

Figure 1:
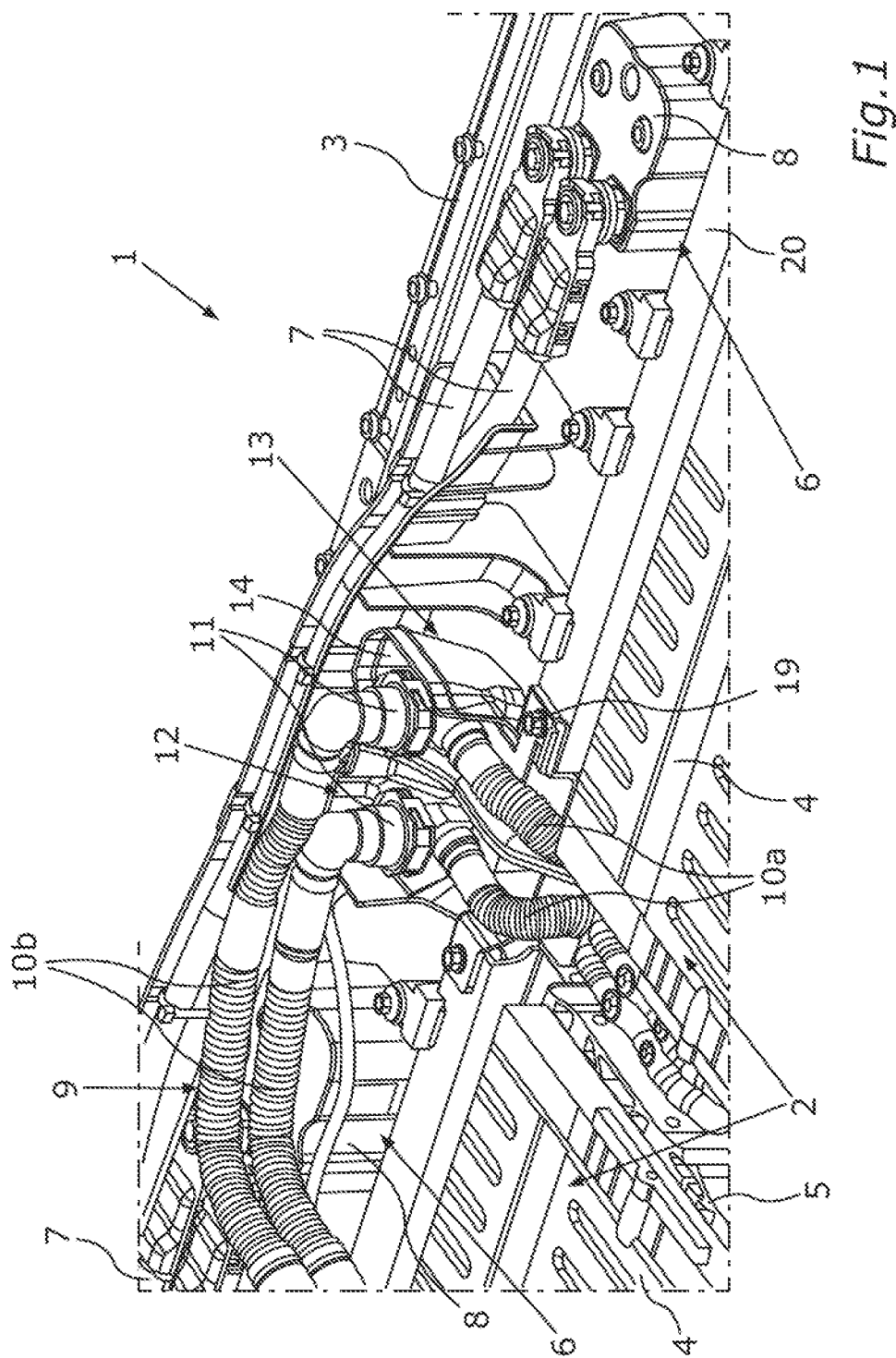
FIG. 1 is a schematic representation of a section of an electrical energy storage device with an assembly.

FIG. 1 shows a section of an electrical energy storage device 1 that is realized, in particular, as a high-voltage energy storage device. The high-voltage energy storage device may be used, for example, as a traction battery for an electrically drivable motor vehicle. The electrical energy storage device 1 has a plurality of energy storage modules 2 that are arranged in at least two planes in a storage housing 3 of the electrical energy storage device 1, and of which two energy storage modules 2 of a first, lower plane are shown here. The energy storage modules 2 have a plurality of energy storage cells that are interconnected via a cell contact system 4 in each case to form a cell array. The cell array is arranged in a cell module frame 5. In this case, voltage-carrying, in particular high-voltage-carrying, components 6 in the form of high-voltage leads 7 and high-voltage terminals 8 are arranged in a second, upper level.

Figure 2:
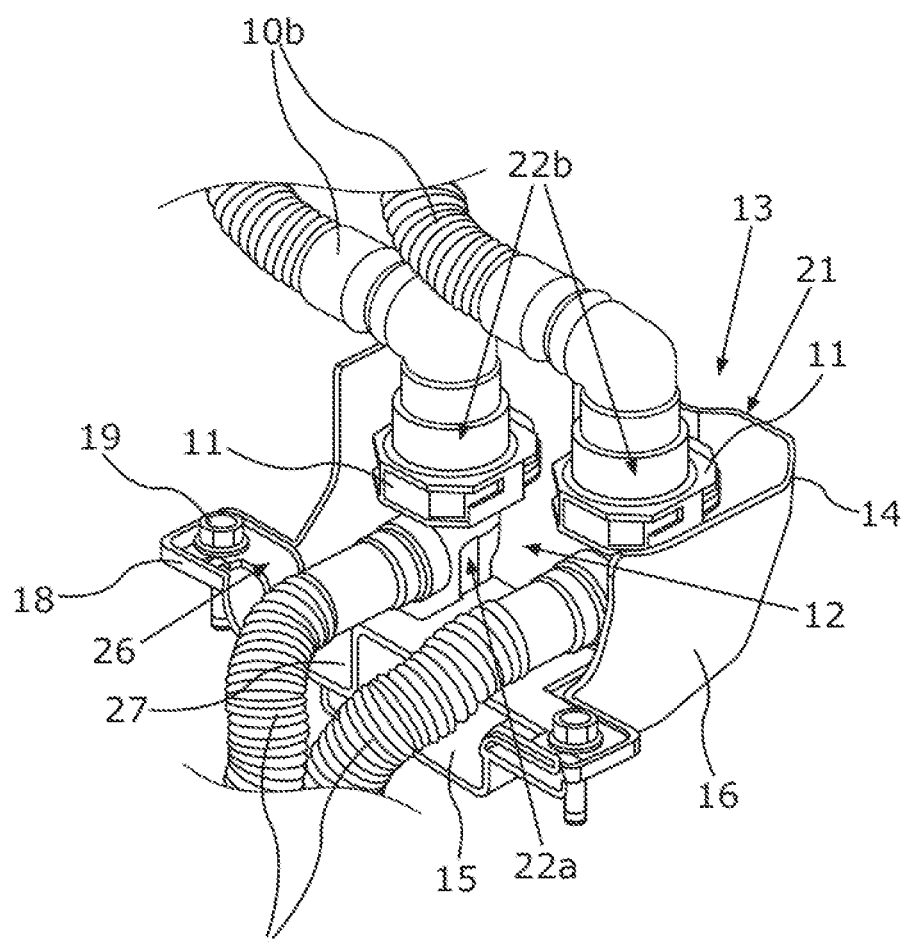
FIG. 2 is a schematic representation of the assembly according to FIG. 1.

The electrical energy storage device 1 additionally has a cooling system, of which part of a pipeline network 9 is shown here. Via the pipeline network 9, coolant is transported to the heat sinks of the energy storage modules 2, or away from the heat sinks of the energy storage modules 2. The pipeline network 9 has pipelines 10a, 10b, and pipeline connections 11, via which the pipelines 10a, 10b are fluidically coupled to one another. These pipeline connections 11 couple pipelines 10a for energy storage modules 2 of the lower level to pipelines 10b for energy storage modules 2 of the upper level. These pipeline connections 11 form a pipeline portion 12 that is susceptible to coolant leakage. In the event of a leakage, coolant can leak out in the region of this pipeline portion 12. In order to prevent the leaking coolant from reaching the high-voltage-carrying components 6 arranged in the upper level, the electrical energy storage device 1 additionally has a coolant discharger 13 that is designed to divert the leaking coolant away from the upper level and thus away from the high voltage carrying components 6. The coolant discharger 13 is shown, with the pipeline portion 12, in FIG. 2 and FIG. 3.

The coolant discharger 13 has a drainage ramp 14 that in this case is realized as a separate constructional element, for example made of plastic. The drainage ramp 14 has an obliquely sloping discharge portion 15 that is arranged beneath the pipeline portion 12 and that can discharge the leaking coolant downward, for example to a housing base, not shown here, of the storage housing 3. Arranged so as to project upward from the discharge portion 15 there is wall portion 16 that encases the pipeline portion 12 in certain regions. In particular, the wall portion 16 is arranged between the pipeline portion 12 and the voltage-carrying components 6, in order to prevent the coolant from reaching the voltage-carrying components 6. To enable the drainage ramp 14 to be attached to the storage housing 3, the coolant discharger 13 has a connection portion 17, in this case realized as tabs 18 that project laterally from the discharge section 15 and that each have a screw hole. A screw 19 can be inserted through each of the screw holes, such that the drainage ramp can be screw-fastened, for example to a holding strut 20 of the storage housing 3.

The drainage ramp 14 in this case is arranged at two adjacent pipeline connections 11 of the pipeline network 9 that form the pipeline portion 12 susceptible to coolant leakage. The wall portion 16 in this case has two outwardly projecting convexities 21. Each convexity 21 partially encases a pipeline connection 11. Each pipeline connection 11 has two pipe connection elements 22a, 22b. A first, lower pipe connection element 22a is connected to a lower pipeline 10a, and a second, upper pipe connection element 22b is connected to an upper pipeline 10b. The pipe connection elements 22a, 22b can be connected to each other, for example plugged and/or screwed together, to form the pipeline connection 11 and thus to fluidically couple the pipelines 10a, 10b.

Figure 3:
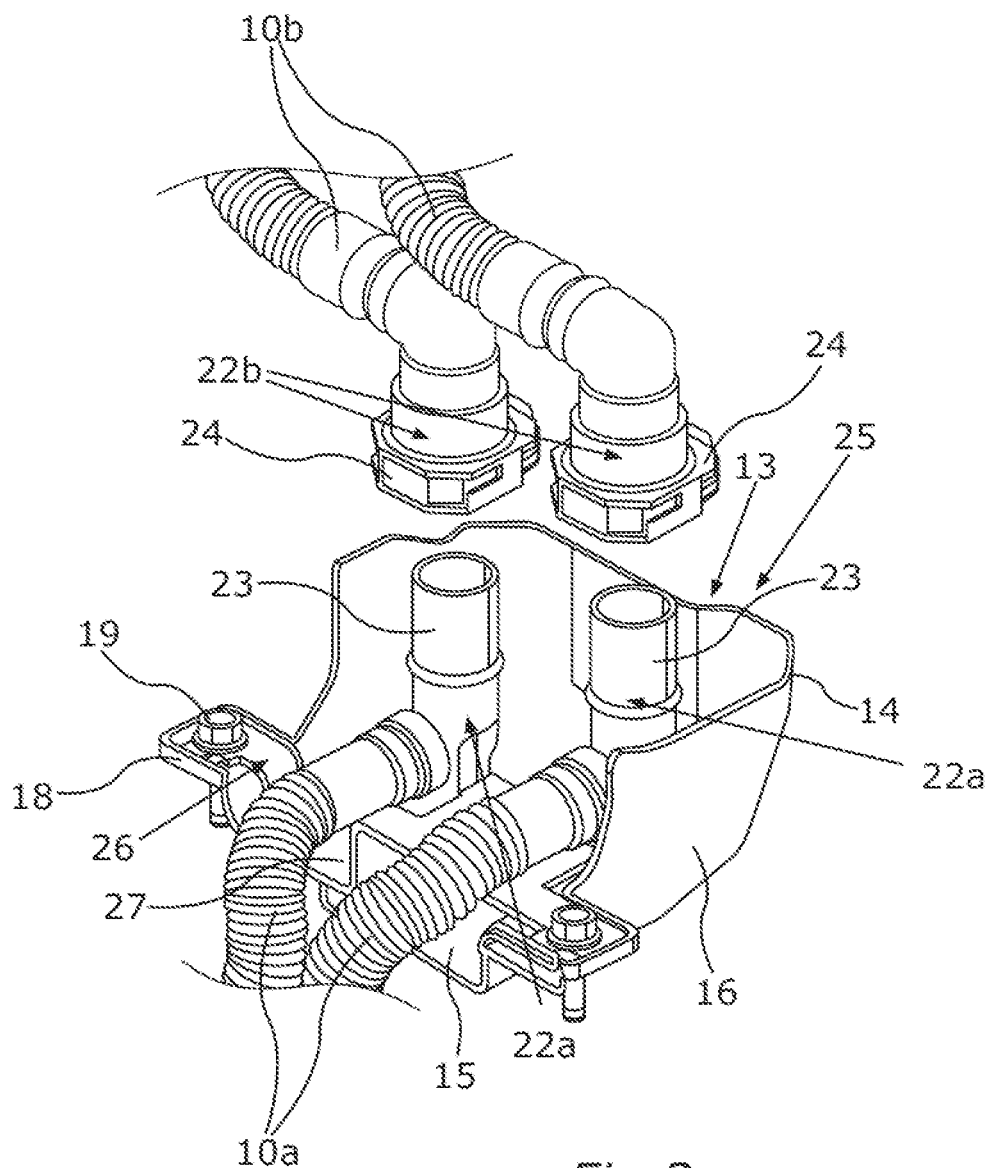
FIG. 3 is a schematic representation of the assembly according to FIG. 2, in an exploded representation.

In FIG. 3, the pipe connection elements 22a, 22b of the pipeline connection 11 are shown in the unconnected state. The lower pipe connection element 22a in this case is realized as a pipe stub 23 that can be inserted into the upper pipe connection element 22b in the form of a pipe sleeve 24. The lower pipe connection elements 22a and the drainage ramp 14 in this case form a preassembled assembly 25 in that the pipe connection elements 22a are attached to the drainage ramp 14. For this purpose, the coolant discharger 13 has a holding element 26 in the form of a bracket 27 that is likewise attached to the tabs 18, and thus to the drainage ramp 14, for example by means of the screws 19, and to which the pipe connection elements 22a are attached. The pipe connection elements 22a and the drainage ramp 14 are preassembled by means of the holding element 26 and can be arranged in the storage housing 3 in one assembly step.

The foregoing disclosure has been set forth merely as illustrative and is not intended to be limiting. Since modifications of the disclosed embodiments incorporating the spirit and substance of the disclosure may occur to persons skilled in the art, the invention should be construed to include everything within the scope of the appended claims and equivalents thereof.

What is claimed is:

1. A coolant discharger for a coolant-carrying pipeline network of a battery, comprising:
   at least one drainage ramp configured to be arranged on a pipeline portion of the pipeline network that is susceptible to a coolant leakage,
   wherein the at least one drainage ramp is configured to discharge a coolant leaking out from the pipeline portion in the event of a coolant leakage and to divert the coolant away from voltage-carrying components of the battery, and
   wherein the at least one drainage ramp comprises a discharge portion configured to discharge the coolant from the coolant discharger,
   the coolant discharger also comprising:
   a bracket configured to hold the at least one drainage ramp on the pipeline portion, wherein the bracket is a separate component from both the drainage ramp and the pipeline portion.

2. The coolant discharger according to claim 1, wherein the discharge portion slopes obliquely downward and is configured to be arranged beneath the pipeline portion susceptible to coolant leakage; and
   wherein the at least one drainage ramp comprises a wall portion projecting upward from the discharge portion and configured to at least partially encase the pipeline portion.

3. The coolant discharger according to claim 2, wherein the wall portion comprises at least one convex portion configured to receive a sub-region of the pipeline portion.

4. The coolant discharger according to claim 3, wherein the wall portion comprises two convex portions configured to receive two adjacent sub-regions of the pipeline portion.

5. The coolant discharger according to claim 2, wherein
   wherein the discharge portion slopes obliquely downward, with respect to a direction of gravity, in first direction toward a first lateral side of the coolant discharger,
   wherein the wall portion projects upward from the discharge portion on at least a second lateral side of the coolant discharger that is opposite from the first lateral side of the coolant discharger,
   wherein the coolant discharger is absent a wall portion on the first lateral side of the coolant discharger such that the coolant is discharged from the discharge portion at the first lateral side due to gravity.

6. The coolant discharger according to claim 1, wherein the coolant discharger comprises a connection portion configured to mechanically connect the at least one drainage ramp to a storage housing of the battery.

7. The coolant discharger according to claim 6, wherein the connection portion comprises tabs that project laterally from the discharge portion and that each have at least one hole.

8. The coolant discharger according to claim 6, wherein the bracket is directly connected to the connection portion by a fastener, and wherein the same fastener is also configured to mechanically connect the connection portion to the storage housing of the battery.

9. The coolant discharger according to claim 1, wherein the bracket is attached in a non-destructively detachable manner to the at least one drainage ramp.

10. The coolant discharger according to claim 1, wherein at least one pipeline element of the pipeline portion susceptible to coolant leakage is attached to the at least one drainage ramp, forming a preassembled assembly.

11. The coolant discharger according to claim 10, wherein the at least one pipeline element comprises a pipe connection element of a pipeline portion susceptible to coolant leakage, the pipe connection element comprising a pipeline connection configured to connect two pipelines of the pipeline network, wherein the at least one drainage ramp is attached to the pipe connection element.

12. A battery for a motor vehicle, the battery comprising:
at least one voltage-carrying component;
a coolant-carrying pipeline network for cooling the at least one voltage-carrying component including the pipeline portion susceptible to a coolant leakage; and
the coolant discharger according to claim 1.

13. A motor vehicle having the battery according to claim 12.

14. The coolant discharger according to claim 1, wherein the bracket has a length that spans at least an entire width of the at least one drainage ramp.

* * * * *